United States Patent
Jafarian-Tehrani

(10) Patent No.: US 8,466,697 B2
(45) Date of Patent: Jun. 18, 2013

(54) ARRANGEMENTS FOR DETECTING DISCONTINUITY OF FLEXIBLE CONNECTIONS FOR CURRENT FLOW AND METHODS THEREOF

(75) Inventor: Seyed Jafar Jafarian-Tehrani, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 459 days.

(21) Appl. No.: 12/431,593

(22) Filed: Apr. 28, 2009

(65) Prior Publication Data

US 2010/0271040 A1    Oct. 28, 2010

(51) Int. Cl.
G01N 27/62    (2006.01)
G01R 31/04    (2006.01)

(52) U.S. Cl.
USPC .................. 324/713; 324/464; 324/538

(58) Field of Classification Search
USPC ................ 324/126, 127, 464, 538–544, 713
See application file for complete search history.

(56) References Cited

U.S. PATENT DOCUMENTS

| | | | | |
|---|---|---|---|---|
| 5,486,756 | A  * | 1/1996 | Kawakami et al. | 324/127 |
| 6,876,205 | B2 * | 4/2005 | Walde et al. | 324/536 |
| 7,145,345 | B2 * | 12/2006 | Sarkozi et al. | 324/543 |
| 7,271,580 | B1 * | 9/2007 | Fenske et al. | 324/127 |
| 2008/0116876 | A1 * | 5/2008 | White et al. | 324/76.11 |
| 2008/0179005 | A1 * | 7/2008 | Sagae et al. | 156/345.28 |
| 2009/0061542 | A1 | 3/2009 | Patrick | |

FOREIGN PATENT DOCUMENTS

| | | |
|---|---|---|
| JP | 10-079350 A | 3/1998 |
| KR | 10-2004-0042451 A | 5/2004 |
| KR | 10-2004-0108751 A | 12/2004 |

OTHER PUBLICATIONS

"International Search Report", Issued in PCT Application No. PCT/US2010/032413; Mailing Date: Dec. 6, 2010.
"Written Opinion", Issued in PCT Application No. PCT/US2010/032413; Mailing Date: Dec. 6, 2010.

* cited by examiner

*Primary Examiner* — Melissa Koval
*Assistant Examiner* — Farhana Hoque
(74) *Attorney, Agent, or Firm* — IPSG, P.C. Intellectual Property Law

(57) ABSTRACT

A detection circuit arrangement in a plasma processing chamber having movable lower electrode is provided. The arrangement includes flexible connector having a first flexible connector end, a second flexible connector end and at least a slit. At least portion of the slit is disposed in a direction parallel to a line drawn between two flexible connector ends. One end is coupled to the movable lower electrode and another end is coupled to a component of the plasma processing chamber. Flexible connector provides low impedance current path between the movable lower electrode and the component of the plasma processing chamber. The arrangement also includes means for detecting current flow through conductor material disposed on one side of the slit. The means for detecting includes at least a coil wound around the conductor material and a detector circuit coupled to the coil for detecting the current flow interruption due to a tear.

17 Claims, 10 Drawing Sheets

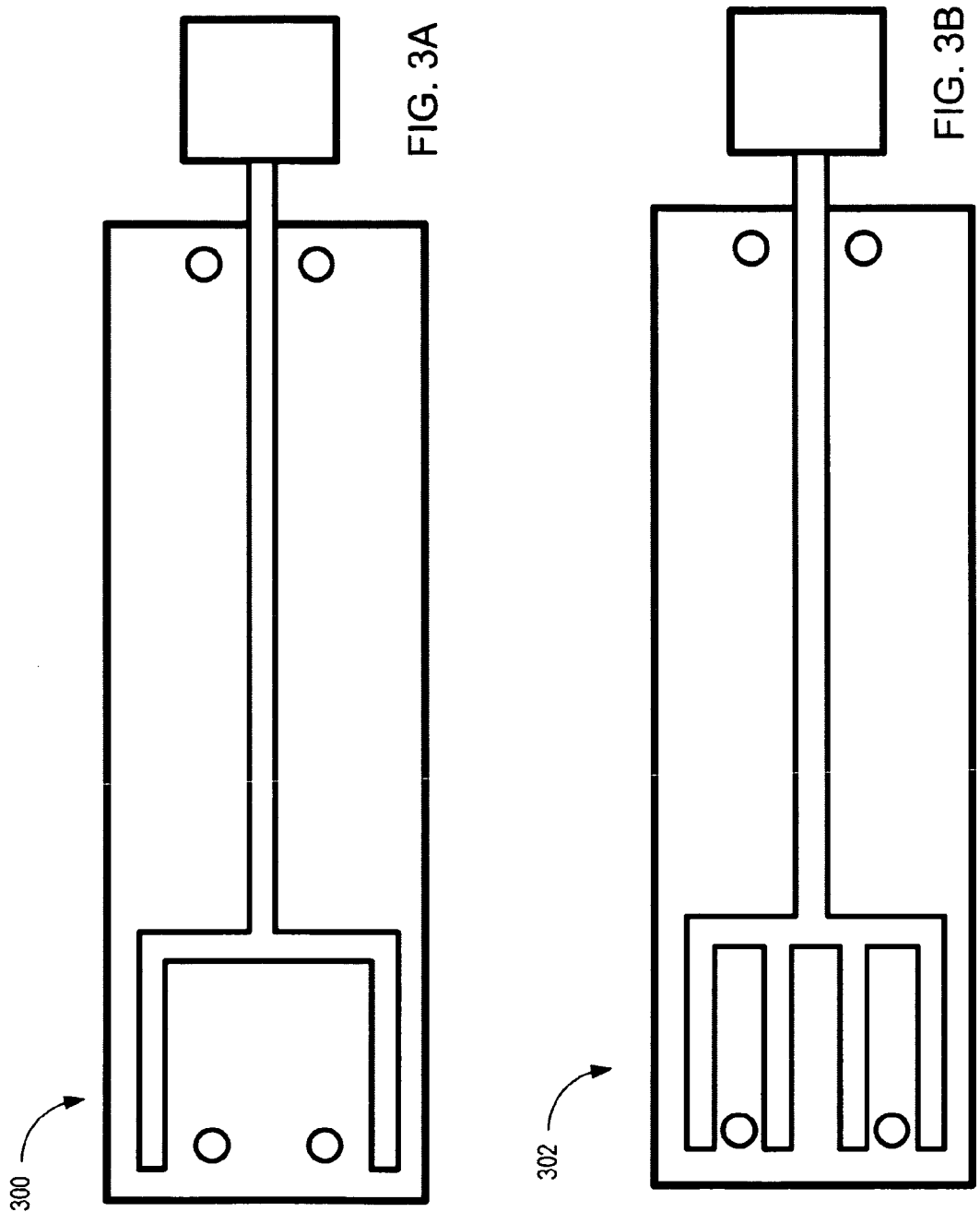

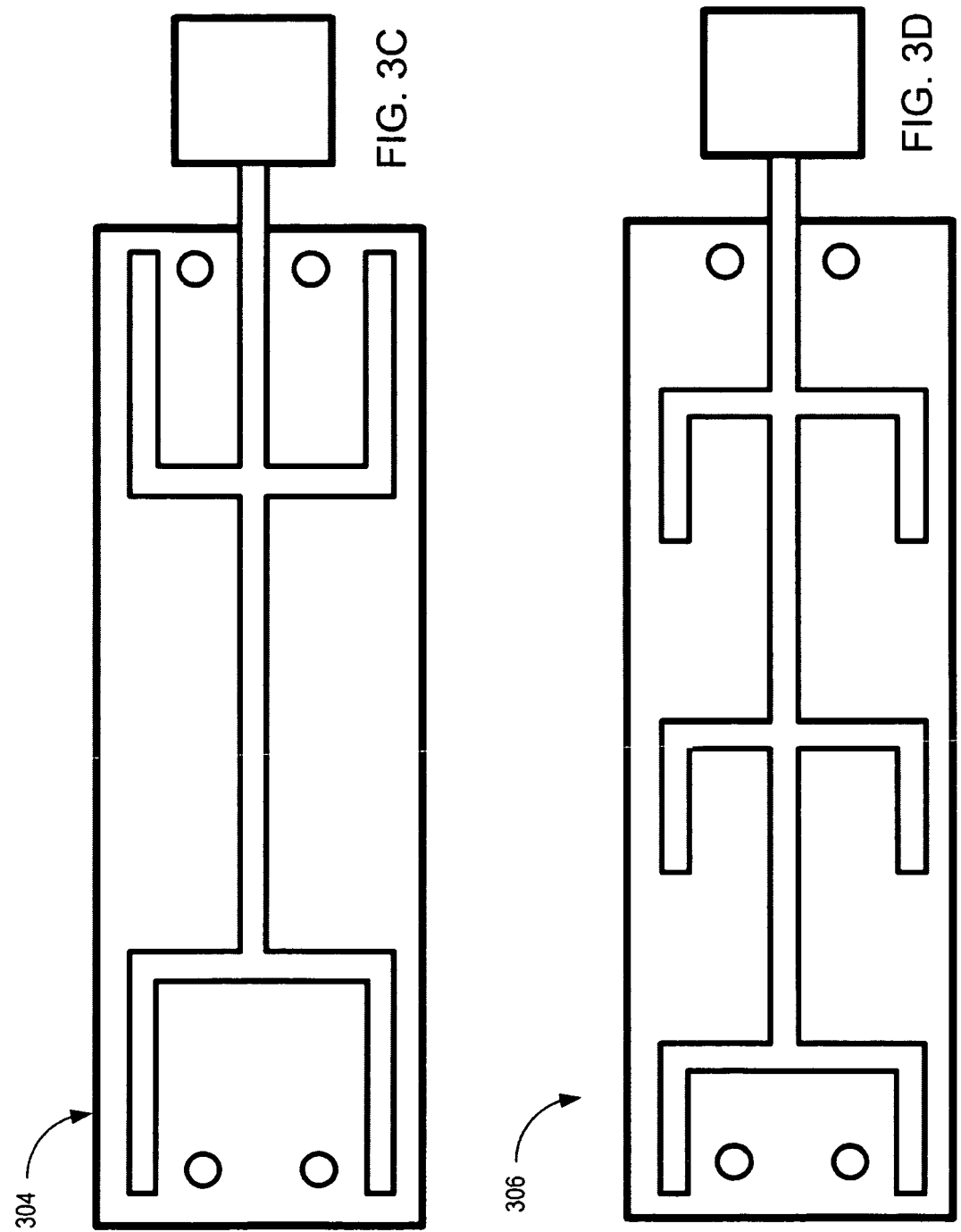

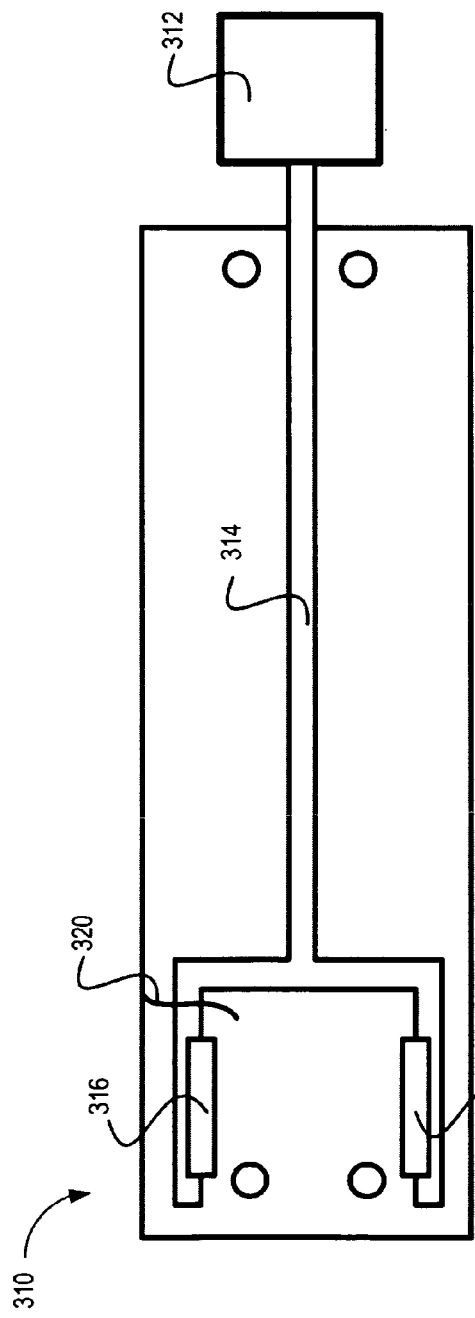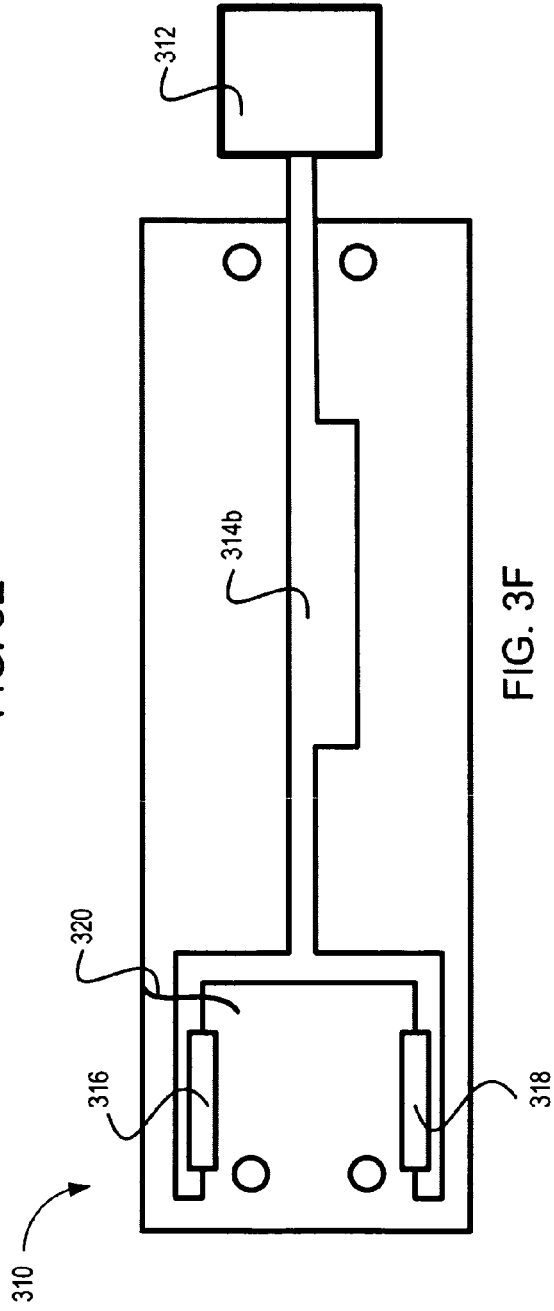
FIG. 3E
FIG. 3F

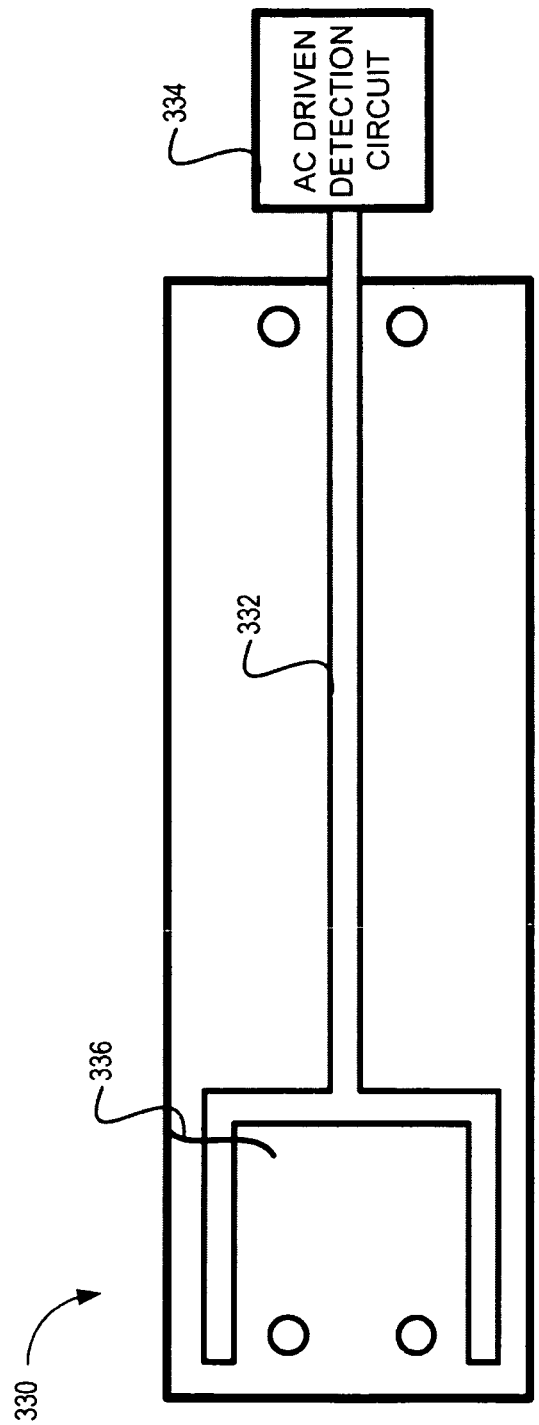

ARRANGEMENTS FOR DETECTING DISCONTINUITY OF FLEXIBLE CONNECTIONS FOR CURRENT FLOW AND METHODS THEREOF

BACKGROUND OF THE INVENTION

Advances in plasma processing have provided for growth in the semiconductor industry. During substrate processing, conditions of the chamber may impact substrate processing. A critical parameter that may affect the plasma processing of substrates is the flow of the radio frequency (RF) current.

To facilitate discussion, FIG. 1 shows a simple block diagram of a capacitively-coupled plasma processing system 100 with a processing chamber 102 having an adjustable gap. In an adjustable-gap processing chamber 102, a lower electrode, such as an electrostatic chuck 104, may be configured to be adjustable to enable a plasma, which may be created between an upper electrode 114 and lower electrode 104 (i.e., gap 106), to be modified as needed.

Consider the situation wherein, for example, RF current from an RF supply 108 flows through an RF match 110 into processing chamber 102 during substrate processing. The RF current may travel along a path 116 to couple with a gas reactant to create plasma for processing a substrate 112, which is disposed on electrostatic chuck 104.

Those skilled in the arts are aware that RF current flowing into the plasma processing system 100 usually tries to return to its RF source. However, the RF current may not flow along the intended path to return to its RF source. The uncontrolled flow of RF current back to its RF source may cause processing conditions to fall outside of the design window. In an example, uncontrolled flow of RF current may cause substrate 112 to experience non-uniformity during substrate processing and may result in a greater number of defective devices.

Since RF current tends to seek a path with low impedance, a low impedance path may be provided to direct the flow of RF current. One method of providing for a low impedance path is by employing a set of straps 118. In an example, eight straps may be symmetrically connected to electrostatic chuck 104 and/or the inner lining of processing chamber 102. The eight straps enable the RF current to flow out in a radial direction with respect to substrate 112, thereby minimizing non-uniformity and providing a more deterministic path for the RF current.

Since set of straps 118 is employed to provide a deterministic return path for the RF current, the integrity of the set of straps 118 needs to be maintained. In other words, the set of straps 118 has to be in good working condition to ensure that the deterministic path of the RF current is available. However, conditions may exist that may cause set of straps 118 to lose its integrity and create an inconsistent RF return impedance causing shift in wafer processing result.

As aforementioned, lower electrode 104 is elevated and lowered to modify the plasma created during substrate plasma processing. Since set of straps 118 is attached to electrostatic chuck 104, set of straps 118 is also configured to move along with electrostatic chuck 104. Over time, material fatigue (e.g., metal fatigue) may cause set of straps 118 to break (such as a tear in one of the straps). Once a break occurs in a strap, the cross-sectional area of the strap is changed, thereby increasing the impedance of the strap. As a result, the RF current may not flow as intended.

In another example, the connection between a strap of the set of straps 118 to lower electrode 104 and/or the inner lining of processing chamber 102 may break. As a result, the RF current may be altered.

Besides the aforementioned reasons, the design of a strap may also impact the strength, flexibility and durability of the strap. If the material that has been utilized to create the strap is poorly chosen, for example, the strap may not be able to withstand the corrosive plasma processing conditions or present a lossy current path affecting the efficiency of the power delivery system. Power loss due to poor choice of base material may heat up the strap and may cause premature failure.

BRIEF SUMMARY OF THE INVENTION

The invention relates, in an embodiment, to a detection circuit arrangement in a plasma processing chamber having a movable lower electrode. The detection circuit arrangement includes a flexible connector having a first flexible connector end, a second flexible connector end and at least a slit. At least a portion of the slit is disposed in a direction parallel to a line drawn between the first flexible connector end and the second flexible connector end. The first flexible connector end is coupled to the movable lower electrode and the second flexible connector end is coupled to a component of the plasma processing chamber, wherein the flexible connector is configured to provide a low impedance current path between the movable lower electrode and the component of the plasma processing chamber. The detection circuit arrangement also includes means for detecting current flow through conductor material disposed on one side of the slit. The means for detecting includes at least a coil wound around at least the conductor material disposed on the one side of the slit and a detector circuit coupled to the coil for detecting the current flow.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which:

FIGS. 3A-3D show, in various embodiments of the invention, examples of different configurations for a laminated detection circuit arrangement.

FIGS. 3E and 3F show, in an embodiment of the invention, examples of different configurations for a laminated detection circuit arrangement with a circuit and a set of resistors.

FIG. 3G shows, in an embodiment of the invention, a simple diagram of a laminated detection circuit arrangement with circuit.

DETAILED DESCRIPTION OF EMBODIMENTS

Figure 1:
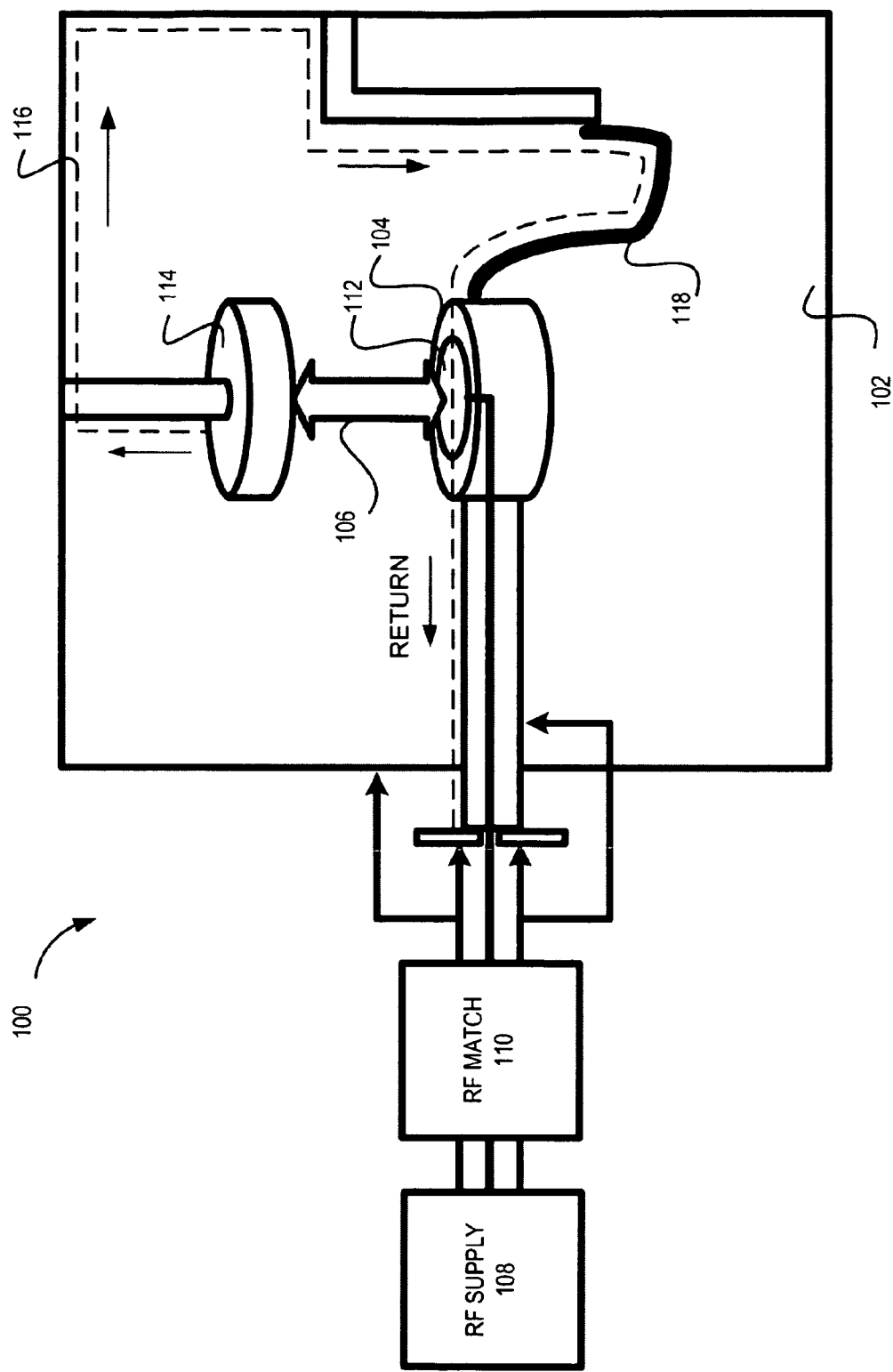
FIG. 1 shows a simple block drawing of a capacitively-coupled plasma processing system with an adjustable-gap processing chamber.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, in the prior art, a tear or break in a strap may cause the RF current to flow in a non-deterministic manner and may cause substrate processing to occur outside of the design window. In one aspect of the invention, the inventor herein realized that by having an arrangement that timely identifies connection discontinuity or variation for the RF current flow, waste may be minimized since the tear or break may be identified before too many substrates are defectively processed.

However, the tear or break on the strap is not easily detected. Currently, monitoring procedures have been implemented to identify abnormal changes to processing conditions within the chamber. However, since a tear or break in the strap may cause fluctuations in the current flow that may be less than two percent, for example, the standard monitoring procedures may not be able to detect the changes, especially if the processing chamber is operating at a relatively high frequency, e.g., in the range of 200 KHz or higher.

In accordance with embodiments of the present invention, one or more detection circuit arrangements are provided to identify a discontinuity of a connector, such as a strap (or other flexible connectors), within a plasma processing system. Embodiments of the invention include an integrated detection circuit arrangement for identifying a change in the RF current flow due to a tear or break in a connector. Embodiments of the invention also include a laminated detection circuit arrangement that may be adhered to a connector to enable detection of the discontinuity of the RF current flow without requiring the modification of the connector.

In an embodiment of the invention, an integrated detection circuit arrangement is provided for identifying a change in the RF current flow. The integrated detection circuit arrangement includes a connector, such as a strap. The connector may be made of any material that provides low impedance to RF current while still being able to withstand the processing condition within the processing chamber. Those skilled in the arts are aware that prior art currently employs connectors within a processing chamber to direct the flow of RF current.

In an embodiment, each connector may include a slit. The slit may be connected to a circuit arrangement that is electrically isolated from the connector. As the RF current flows through the connector, the RF current induces a current on the coil of the circuit arrangement that is connected to the slit. In an embodiment, the circuit arrangement (such as via a detector circuit) is configured to measure the resonance frequency and/or the impedance of the current flow to identify changes in the current flow. As long as the RF current flow does not vary, the current flowing through the coil is kept at a substantially steady rate, therefore the resonance frequency and/or the impedance remains substantially constant.

However, if the connection is broken (e.g., tear), the flow of the RF current is disrupted and/or changed, thereby causing a change in the current flowing through the coil. The variation may be captured by the circuit arrangement as a change in the resonance frequency and/or impedance. In an embodiment, the circuit arrangement is configured to send an alert to the operator, thereby notifying the operator of a tear or break in the connector.

Those skilled in the arts are aware that due to processing conditions within the processing chamber, the RF current flow in the processing chamber may not always be at a constant rate. Instead, the RF current flow may experience slight fluctuations even if the current-carrying conductors are not defective. To account for the slight fluctuations that may be expected to occur during substrate processing, the circuit arrangement may be configured to only send an alert to the operator if the change in the current flowing through the coil is outside of an acceptable predefined threshold or range, in an embodiment.

In an embodiment, the number of slits and/or the positioning of the slits on a connector may vary depending upon preference. In an example, an integrated detection circuit arrangement may include a set of slits positioned along the edges of the connector. In another arrangement, the set of slits may be randomly positioned across the connectors. Since tears in a connector usually occur at positions in which maximum flexing may occur, the slit(s) may be positioned at or close to the location(s) on the connector that may statistically be more likely to tear or break. In yet another example, the set of slits may be positioned along the outer edges of the connector since most tears statistically have occurred toward the edge of the connector. The invention, however, is not limited by the number of slits and the positioning of the slit on the connector.

In an embodiment, an integrated detection circuit arrangement with multiple slits includes one or more circuit arrangements for detecting the change in the current flow at any one of a plurality of locations on a single strap or in any one of a plurality of straps. Since only one circuit arrangement is configured to measure the fluctuations of the current flow, changes in the RF current flow through the connector may be measured with a single circuit arrangement regardless of the placement of the tear. In an alternative embodiment, each slit may be individually attached to a respective circuit arrangement to provide granularity in data collection. Although, the number of circuit arrangements that may be employed to monitor the flow of current through the coil may vary depending on preference, space constraint and complexity may be some of the factors that may need to be considered in designing the integrated detection circuit arrangement.

The aforementioned circuit arrangement is a passive arrangement. However, the chamber condition may make detecting changes in the RF current flow due to a tear or break difficult, especially if the processing chamber is operating at a fairly high frequency. To improve detection in these cases, the circuit arrangement may also be an active arrangement in which power, such as an AC (alternating current) signal, may be induced in the coil.

In an embodiment, the power running through the coil may be driven at a different frequency than the frequency associated with the RF current flowing through the processing chamber. By differentiating the coil frequency from the chamber frequency, changes in the current flow through the coil due to a tear or break in the connectors may be more easily detected. Further, since a specific frequency is being applied to the coil, the circuit that is employed to detect changes in the current flow may be simplified to the known frequency that is being induced on the coil. Also, since the circuit arrangement may be preprogrammed to monitor a specific frequency, more data granularity may be achieved since the circuit arrangement is no longer required to monitor a plethora of frequencies.

As aforementioned, to provide a more deterministic return path for the RF current, multiple connectors may be attached between the lower electrode and/or a component (such as the inner lining) of the chamber. The connectors are arranged in a manner that allows the RF current to flow in a symmetrical radial direction from the substrate, which is disposed on the lower electrode. As mentioned, in an embodiment, the circuit arrangement may have a one-to-one relationship in which each connector is connected to a circuit arrangement. Thus, a tear or break in a specific connector is identified by the circuit arrangement that is integrated with the connector. As a result, the operator is able to quickly identify and replace the "bad" connector.

Instead of a one-to-one circuit arrangement, the integrated detection circuit arrangement may be simplified to include only a single circuit arrangement for multiple connectors, in an embodiment. The single circuit arrangement may be employed if another method (such as a quick physical check) may be easily employed to quickly determine which connector may have to be replaced once a break in one of the connectors has been identified. Also, the single circuit arrangement may be preferable if the cost of replacing all of the connector is cheaper than adding additional circuit arrangements to monitor each connector.

The connector described in the integrated detection circuit arrangement may be easily modified in order to accommodate the circuit arrangement by simply creating slits and/or providing coils. In an embodiment of the invention, however, a laminated detection circuit arrangement may be employed without having to modify the connector. Instead, the laminated detection circuit arrangement may be affixed onto one side of the connector. In an embodiment, the laminated detection circuit arrangement may be-pre-stretched to enable the laminated detection circuit to mimic the condition of the connector (such as resiliency) as the connector moves up and down as the lower electrode is elevated or lowered.

In an embodiment, the laminated detection circuit arrangement is a simple detection loop. The laminated detection circuit arrangement may be stretched across the length of the connector. In an embodiment, the detection loop may branch out into a prong or teeth configuration. The number of prongs/teeth may vary depending upon the manufacturer's preference. Since connectors tend to break at the point of maximum flexibility, the positioning of the prongs/teeth may be positioned at the locations that have been statistically identified as being most likely to break.

In an embodiment of the invention, the laminated detection circuit arrangement is a DC (direct current) circuit with a set of resistors. With the resistors intact, the normal current flowing through the coil of the laminated detection circuit arrangement usually has a fairly low value. However, if a break occurs in the connector, the RF current path may be directed away from the resistors, thereby causing the current flowing through the coil to have a significantly higher current value. In some situations, a tear may occur at a point in which flexing may cause the two sides of the torn connector to intermittently make contact. In an embodiment, the detection circuit may be preprogrammed to identify the intermittent signals as changes in the current flow.

In an embodiment, the laminated detection circuit arrangement may be an active circuit in which AC power is provided to the detection circuit. Similar to the aforementioned integrated detection circuit arrangement, the driven AC power enables the coil frequency to be different from the processing chamber frequency, thereby simplifying the monitoring process. As a result, granularity of data may be improved since only specific frequency data is gathered.

The features and advantages of the present invention may be better understood with reference to the figures and discussions that follow.

Figure 2A:
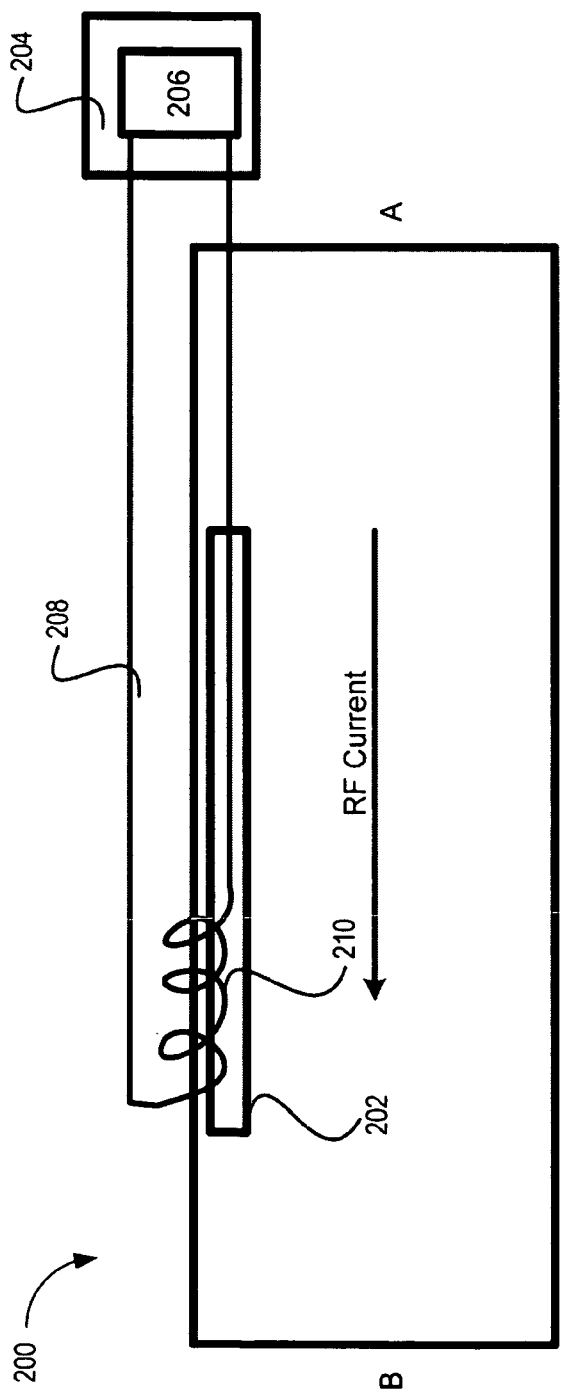
FIGS. 2A-2C show, in various embodiments of the invention, examples of different configurations for an integrated detection circuit arrangement for detecting change in the RF current flowing through one or more straps.
Figure 2B:
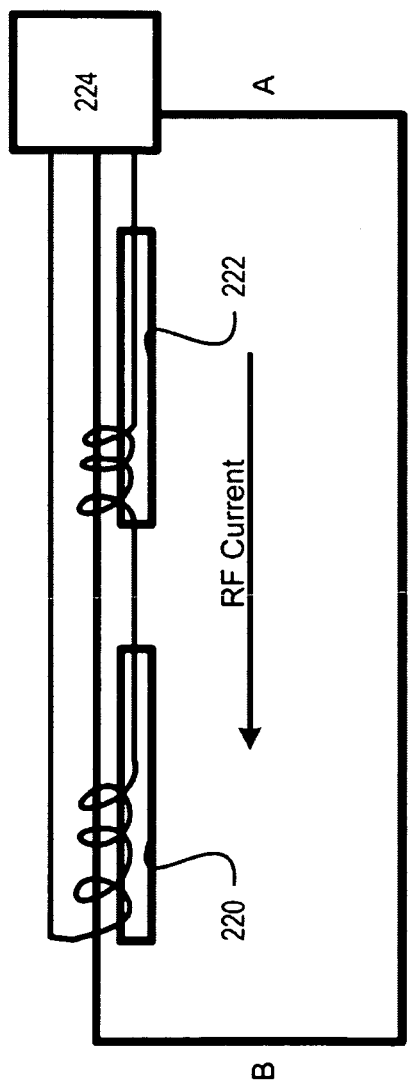
Figure 2C:
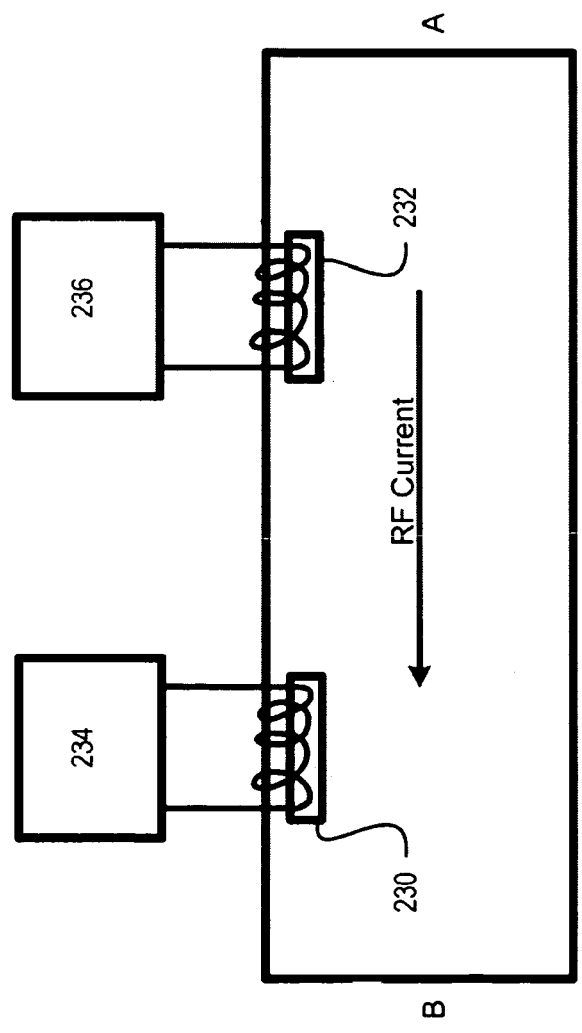

FIGS. 2A-2C show, in various embodiments of the invention, examples of different configurations for an integrated detection circuit arrangement for detecting change in the RF current flowing through one or more straps. The integrated detection circuit arrangement is an arrangement that advantageously requires a connector to be modified in a simple manner in order to implement the integrated detection circuit arrangement.

A connector 200 of FIG. 2A includes a slit 202, which is coupled to a detection circuit arrangement 204, in an embodiment. Detection circuit arrangement 204 may include a monitoring device 206 attached to a detection circuit loop 208, which may include a coil 210.

Consider the situation wherein, for example, RF current supplied to the chamber is flowing back to its RF source via connector 200. As the RF current flows from A to B, for example, the RF current flow induces a current in coil 210. The direction of the flow of the RF current is not relevant in determining if discontinuity exists in the RF current flow due to a tear or break in connector 200.

Data about the induced current in coil 210 is collected and analyzed by monitoring device 206. From the data collected, monitoring device 206 may be able to analyze different parameters, such as the resonance frequency and the impedance. For example, for a connector that is in a "good condition," the induced current is flowing at a substantially steady and known rate during substrate processing. Thus, the resonance frequency and/or the impedance are also substantially constant. However, if a break or tear occurs, the RF current flow is disrupted and the induced current in coil 210 becomes detectably different from the induced current that may exist before the break or tear.

Those skilled in the arts are aware that processing conditions within the processing chamber may cause the RF current flow to experience slight fluctuations even if the current-carrying conductors are not defective. Thus, fluctuations may not always be indicative of a break in the connector. To minimize the potential of false positives from occurring, monitoring device 206 may be configured to send an alert to the operator if the change in the current flowing through detection circuit loop 208 is outside of an acceptable predefined threshold or range, in an embodiment.

In another embodiment of the invention, connector 200 may include multiple slits, as shown in FIGS. 2B and 2C. As can be appreciated from the foregoing, the number of slits and/or the positioning of the slits on a connector may vary depending upon preference. For example, a set of slits may be positioned along the edges of the connector. In another arrangement, the set of slits may be randomly positioned across the connectors. However, given that tears tend to occur at locations in which maximum flexing may occur, the slit(s) may be positioned at or close to the location(s) on the connector that may statistically be more likely to tear or break. The invention, however, is not limited by the number of slits and the positioning of the slit on the connector.

In an embodiment, the slits (220 and 222) may be connected in series to a single monitoring device 224, as shown in FIG. 2B. In another embodiment, each slit (230 and 232) may be connected to its own respective monitoring device (234 and 236), as shown in FIG. 2C. In yet another embodiment, slits in a plurality of connectors (whether one slit per connector or multiple slits per connector) may be coupled to a single monitoring circuit. The complexity of the detection circuit arrangement may vary. Although, the number of circuit arrangements that may be employed to monitor the flow of current through the coil may vary depending on preference, space constraint and complexity may be some of the factors that may need to be considered in designing the integrated detection circuit arrangement.

A tear or break in a connector does not have to occur on the slit since a tear anywhere in the connector is translated into a different level of induced current on the coil. Thus, any tear or break in the connector is ultimately reflected in a change in the induced current on the coil. However, if the tear occurs at or near the slit, a high likelihood exists that the amplitude of the change may be larger and hence more easily detectable. Thus, the multiple-slit design may be preferred.

Figure 2D:
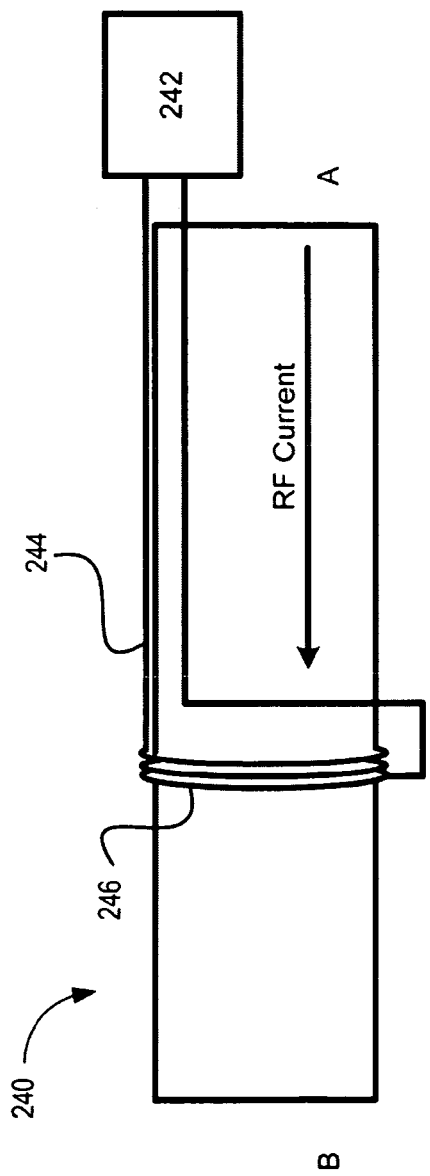
FIG. 2D shows, in an embodiment, an example implementation of an integrated coil wounded around a connector in a multi layer flexible circuit.

Although FIGS. 2A, 2B, and 2C show each coil (such as coil 210) wounded around one or more slit(s), the coil may also be wounded around a non-slitted area of a connector. In one embodiment, a coil may be wounded around the entire connector width, as shown in FIG. 2D. A connector 240 is coupled to a detection circuit arrangement that may include a monitoring device 242 attached to a detection circuit loop 244. Coil 246 of detection circuit loop 244 is wounded around connector 240. By encircling coil 246 around connector 240, the full current flow through connector 240 may be measured.

Figure 2E:
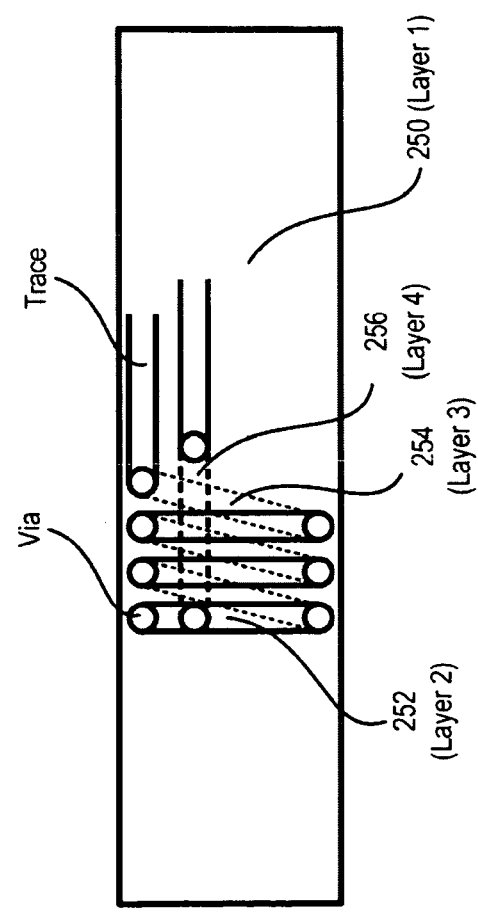
FIG. 2E shows, in an embodiment, an example mechanical implementation of the embodiment of FIG. 2D.

Detection circuit loop 244 may be, in one embodiment, a flexible (e.g., flex) circuit. FIG. 2E shows, in an embodiment, an example mechanical implementation of the embodiment of FIG. 2D. In FIG. 2E there are four layers comprising a flex connector, all of which are insulated from one another (insulation is not shown). First layer 250 is the layer through which the RF current is returned. Layers 2-4 (252, 254, and 256), traces, and the vias are used to implement the coil and the return conductor (detection circuit loop 244 of FIG. 2D) to the monitoring device. Flex circuit is well-known in the art and no additional discussion will be provided. As can be appreciated, the flex circuit example is but one implementation of the flexible circuit. This invention is not limited by the example.

The aforementioned integrated detection circuit arrangement is a passive arrangement. As mentioned, in an embodiment, an active arrangement may be provided in which AC power is provided to the coil. Considered the situation wherein, for example, AC power is provided to detection circuit loop 208 at a specific frequency in FIG. 2A. Unlike the passive arrangement in which a plethora of frequencies may have to be monitored, the monitor device of an active arrangement only has to monitor the frequency at which the AC power is provided to the coil. In other words, the monitor device may be tuned to detect changes at a specific frequency instead of a plethora of frequencies. Thus, granularity of data may be improved since only specific frequency data is gathered and analyzed.

In an embodiment, the AC power may be driven at a frequency that differs from the chamber frequency. Since fluctuations in the RF current flow may be difficult to detect, especially within a chamber that may be operating at a relatively high frequency (e.g., in the range of 200 KHz or higher), providing an induced AC power to the coil that differs from the chamber enables the monitoring device to more easily detect the fluctuation.

FIGS. 3A-3D show, in various embodiments of the invention, examples of different configurations for a laminated detection circuit arrangement. Unlike the integrated detection circuit arrangement of FIGS. 2A-2C, the laminated detection circuit arrangement is compatible with standard connector designs. In other words, the connector design does not have to be modified in order to accommodate the detection circuit arrangement. Instead, the laminated detection circuit arrangement may be affixed (e.g., using an appropriate adhesive) to at least one side of the connector to monitor the RF current return path.

In an embodiment of the invention, the laminated detection circuit arrangement may be pre-stretched to mimic the condition of the connector. Thus, as the connector flexes when a lower electrode is elevated or lowered during substrate processing, the laminated detection circuit arrangement is also flexing along with the connector.

In an embodiment, the laminated detection circuit arrangement is a simple detection circuit loop. The configuration of the detection circuit loop may vary. In an embodiment, the detection circuit loop may have a prong design 300 (FIG. 3A), a teeth design 302 (FIG. 3B), a two-sided-prong design 304 (FIG. 3C), a multiple-prong design 306 (FIG. 3D) and the like. As can be appreciated from the foregoing, the invention is not limited by the positioning or the number of prongs/teeth in the arrangement. However, since connectors tend to break at the point of maximum flexibility, the prongs/teeth may be positioned at the locations that have been statistically identified as being most likely to break.

In an embodiment of the invention, a laminated detection circuit arrangement 310 is a circuit with a set of resistors (FIG. 3E). In an embodiment, the circuit is a DC circuit. In another embodiment, the circuit is an AC circuit. Laminated detection circuit arrangement 310 may include a monitor device 312 connected to a conductor 314. In an embodiment, the configuration of conductor 314 may vary to increase the sensitivity of the detection loop to pick up the operating frequencies. In an example, the configuration of conductor 314*b* of FIG. 3F provides a detection loop that is more sensitive to the changes in the RF current flow at the operating frequencies.

In an embodiment, a set of resistors (316 and 318) or other passive components may be implemented in conductor 314 to lower the value of the current being driven in conductor 314. Thus, if a tear 320 occurs causing a disruption in the monitoring RF current flow, the value of the current flowing through conductor 314 may decrease significantly since conductor 314 has essentially become an open circuit. Since the current value is significantly lower after a break has occurred, the fluctuations in the monitoring RF current flow due to tear 320 may be more easily detected by monitor device 312.

In an embodiment, a laminated detection circuit arrangement 330 is configured as an active circuit (FIG. 3G). Laminated detection circuit arrangement 330 may include a conductor 332 connected to a monitor device 334 capable of sourcing voltage or current. Power (either DC or AC) may be provided at a specific frequency to conductor 332, in an embodiment. Unlike laminated detection circuit arrangement 310 in which different frequencies may have to be monitored, monitor device 334 may be tuned to measure only the frequency at which the power is provided to conductor 332. As a result, granularity of data may be improved since only data about specific frequency is gathered.

In an embodiment, the frequency at which the power is being provided to conductor 332 may differ from the frequencies that may exist within the processing chamber, thereby simplifying the monitoring process. By differentiating the frequency in conductor 332 from the chamber frequencies, the fluctuations in the RF current flow due to a tear (such as tear 336) is more easily detected, especially within a processing chamber that is operating at a fairly high frequency, e.g., in the range of 200 KHz or higher.

Figure 4A:
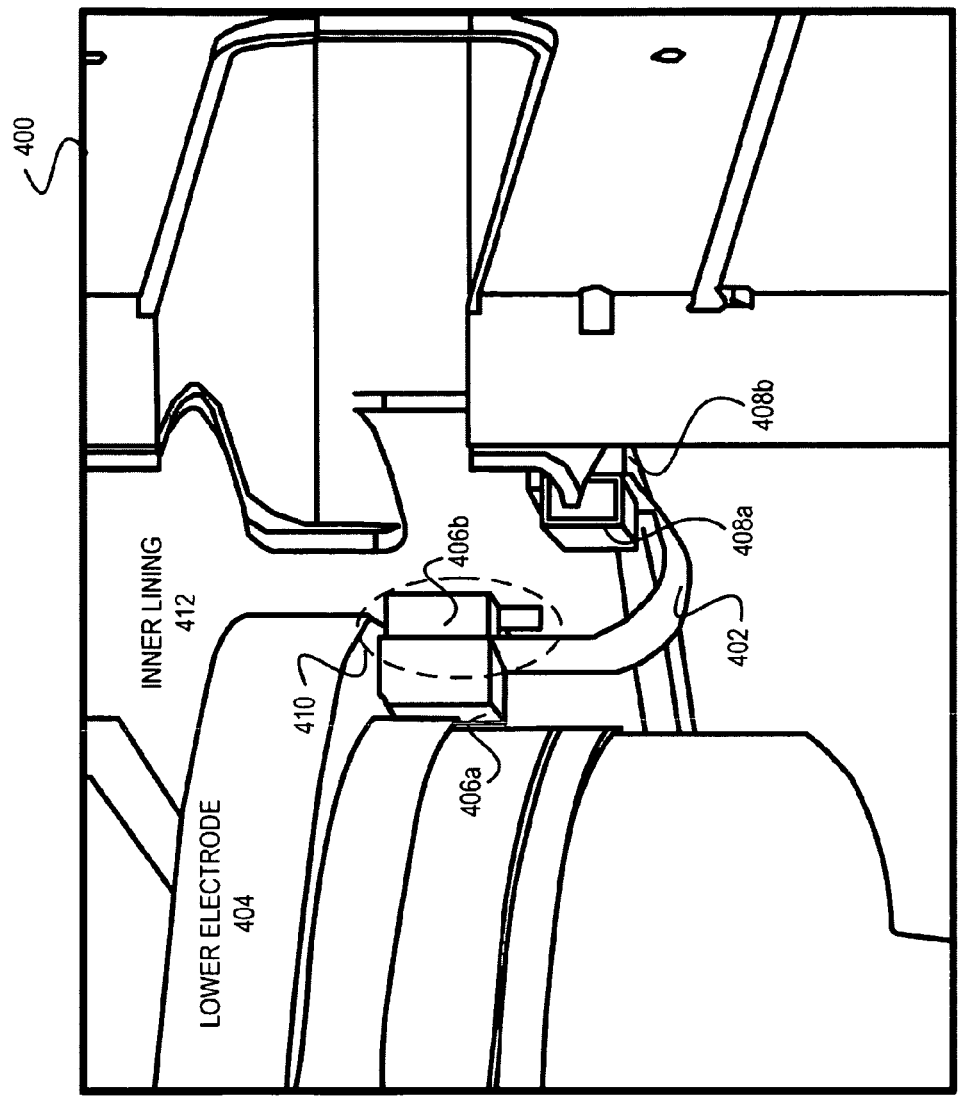
FIG. 4A shows, in an embodiment of the invention, a simple diagram for mounting a connector within a processing chamber.

FIG. 4A shows, in an embodiment of the invention, a simple diagram for mounting a connector 402 within a processing chamber 400. Connector 402 may be mounted to a lower electrode 404 and/or an inner lining 412 of processing chamber 400 via a set of mounting blocks. A first flexible connector end of connector 402 may be mounted to lower electrode 404 via a mounting block arrangement 410 (406a and 406b). In an embodiment, connector 402 may be clamped between mounting block 406a and mounting block 406b. Similarly, a second flexible connector end of connector 402 may be mounted to a component of the processing chamber (such as inner lining 412) via a mounting block arrangement (408a and 408b). Again, connector 402 may be clamped between mounting blocks 408a and 408b.

Figure 4B:
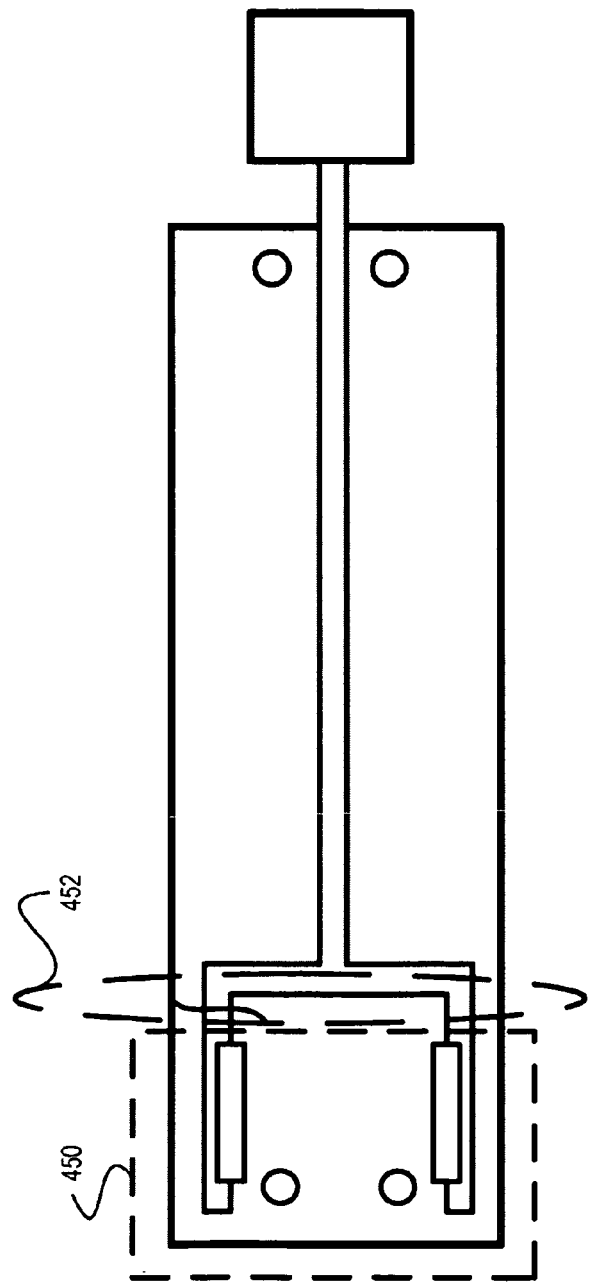
FIG. 4B shows, in an embodiment of the invention, a simple diagram of a connector with the position for mounting the connector identified.

As aforementioned, a non-deterministic RF current return path may be created if a bad connection exists between connector 402 and lower electrode 404 and/or inner lining 412 of processing chamber 400. To account for the potential bad connection, the circuit prong-like pattern of the detection circuit may be positioned at or near the mounting blocks (as shown by mounting block 450 in FIG. 4B). Also, since a break is statistically more likely to happen near a stressed area (such as a location 452), having the circuit prong-like pattern near the mounting blocks or straddling the block boundary allows for a higher likelihood of detecting a break in connector 402 or a short circuit across 452.

Although only connector 402 is shown, similar arrangement may be utilized to mount the other connectors that may be employed to provide a more deterministic route for directing the flow of RF current back to its RF source. Generally, the connectors are arranged in a manner that allows the RF current to flow in a symmetrical radial direction from the substrate, which is disposed on the lower electrode.

In an embodiment, each connector is integrated with a circuit arrangement. With a one-to-one relationship between the connector and the circuit arrangement, a tear or break in a connector is identified by the circuit arrangement that is connected to the connector.

In another embodiment, a single circuit arrangement may be employed to monitor more than one connector. Although the one-to-many circuit arrangement may simplify the detection arrangement, the operator may have to perform additional testing (e.g., physical inspection) to identify the actual connector with the tear. However, if the cost of replacing the connector is relatively cheap, the entire group of connectors may be replaced instead of having to identify the connector with the tear. Further, if the downtime cost required to identify the "bad" connector from a group of connectors is significantly greater than the cost of replacing the entire group of connectors, the entire group of connectors may be replaced when any connector is ascertained to be bad instead of taking the plasma processing system offline for an extended period of time.

As can be appreciated from the forgoing, one or more embodiments of the present invention provide for arrangements and methods for detecting connection discontinuity of or variations in RF current flow within a plasma processing chamber. By integrating a detection circuit arrangement with one or more connectors, a tear or break on a connector may be identified due to fluctuations in the RF current flow within the processing chamber. With a detection circuit arrangement, non-uniformity within the processing chamber may be identified in a timely manner and costly waste due to substrate processing outside of the process window may be minimized.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing, chamber having a movable lower electrode, a detection circuit arrangement comprising:
    a flexible connector having a first flexible connector end, a second flexible connector end and at least a slit, wherein at least a portion of said slit is disposed in a direction parallel to a line drawn between said first flexible connector end and said second flexible connector end, said first flexible connector end is coupled to said movable lower electrode, said second flexible connector end is coupled to a component of said plasma processing chamber, wherein said flexible connector is configured to provide a low impedance current path between said movable lower electrode and said component of said plasma processing chamber; and
    means for detecting current flow through conductor material disposed on one side of said slit, said means for detecting including at least a coil wound around at least said conductor material disposed on said one side of said slit and a detector circuit coupled to said coil for detecting said current flow.

2. The detection circuit arrangement of claim 1 wherein said detector circuit is configured to analyze a set of parameters collected about said current flow to determine when change to said current flow is outside a predefined threshold.

3. The detection circuit arrangement of claim 2 wherein said set of parameters includes at least one of resonance frequency and impedance.

4. The detection circuit arrangement of claim 3 wherein said flexible connector includes multiple slits, wherein said multiple slits are connected to a single detector circuit.

5. The detection circuit arrangement of claim 3 wherein said flexible connector includes multiple slits, wherein each slit of said multiple slits is connected to an individual detector circuit.

6. The detection circuit arrangement of claim 3 wherein an alternating current (AC) signal is applied to said coil.

7. The detection circuit arrangement of claim 6 wherein said AC signal is at a different frequency than a frequency associated with said current flow.

8. In a plasma processing chamber having a movable lower electrode, a detection circuit arrangement comprising:
 a flexible connector having a first flexible connector end and a second flexible connector end, said first flexible connector end is coupled to said movable lower electrode, said second flexible connector end is coupled to a component of said plasma processing chamber, wherein said flexible connector is configured to provide a low impedance current path between said movable lower electrode and said component of said plasma processing chamber; and
 means for detecting current flow through said flexible connector, said means for detecting said current flow including a detector circuit coupled to a laminated detection circuit loop that is laminated onto said flexible connector, said laminated detection circuit loop comprising a conductor that forms at least a main branch and two sub-branches, wherein said laminated detection circuit loop that includes said at least said main branch and said two sub-branches forms a single current loop.

9. The detection circuit arrangement of claim 8 wherein said means for detecting said current flow is pre-stretched to enable said means for detecting said current flow to mimic conditions of said flexible connector as said lower electrode is elevated and lowered.

10. The detection circuit arrangement of claim 8 wherein said means for detecting said current flow includes a set of passive components, wherein said set of passive components includes one of a set of resistors, a set of inductors, and a set of capacitors.

11. The detection circuit arrangement of claim 8 wherein said detector circuit is configured to analyze a set of parameters collected about said current flow to determine when change in said current flow is outside a predefined threshold.

12. The detection circuit arrangement of claim 8 wherein at least one of alternating current signal (AC) and direct current (DC) signal is provided to said conductor.

13. The detection circuit arrangement of claim 12 wherein said at least one of said AC signal and said DC signal is at a different frequency than a frequency associated with said current flow through said flexible connector.

14. A method for identifying discontinuity in a current path during plasma processing, comprising:
 providing a plasma processing chamber having, a movable lower electrode;
 providing a flexible connector having a first flexible connector end and a second flexible connector end, wherein said flexible connector having at least a coil coupled to a detector circuit, wherein said coil coupled to said detector circuit is configured for at least detecting, current flow through said flexible connector; and
 attaching, said first flexible connector end to said movable lower electrode and said second flexible connector end to a component of said plasma processing chamber, wherein said flexible connector is configured to provide a low impedance current path between said movable lower electrode and said component of said plasma processing chamber, wherein said flexible connector includes at least a slit and said coil is wound parallel to a line drawn between said first flexible connector end and said second flexible connector end.

15. The method of claim 14 wherein said coil coupled to said detector circuit is affixed to said flexible connector using an adhesive, wherein said coil coupled to said detector circuit is pre-stretched to enable said coil coupled to said detector circuit to mimic conditions of said flexible connector as said lower electrode is elevated and lowered.

16. The method of claim 14 further including at least collecting data about a set of parameters about said current flow and analyzing said set of parameters via said detector circuit to determine when change in said current flow is outside a predefined threshold.

17. The method of claim 14 further includes inducing at least one of alternating current (AC) signal and direct current (DC) signal on said coil, wherein said at least one of said AC signal and said DC signal is at a different frequency than a frequency associated with said current flow through said flexible connector.

* * * * *